(12) United States Patent
Zhou et al.

(10) Patent No.: US 11,143,782 B2
(45) Date of Patent: Oct. 12, 2021

(54) DOWNHOLE NMR TOOL WITH RECEIVER ON SENSOR

(71) Applicants: Quming Zhou, Houston, TX (US); Marc Stephen Ramirez, Missouri City, TX (US)

(72) Inventors: Quming Zhou, Houston, TX (US); Marc Stephen Ramirez, Missouri City, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 0 days.

(21) Appl. No.: 16/446,831

(22) Filed: Jun. 20, 2019

(65) Prior Publication Data
US 2019/0391292 A1    Dec. 26, 2019

Related U.S. Application Data

(60) Provisional application No. 62/688,704, filed on Jun. 22, 2018.

(51) Int. Cl.
| | |
|---|---|
| *G01V 3/32* | (2006.01) |
| *G01N 24/08* | (2006.01) |
| *G01R 33/44* | (2006.01) |

(52) U.S. Cl.
CPC ............ *G01V 3/32* (2013.01); *G01N 24/081* (2013.01); *G01R 33/44* (2013.01)

(58) Field of Classification Search
CPC ............... G01N 24/081; G01N 24/08; G01R 33/34007; G01R 33/3621; G01R 33/3628; G01R 33/3657; G01R 33/44; G01R 33/3808; G01R 33/445; G01V 3/32
See application file for complete search history.

(56) References Cited

U.S. PATENT DOCUMENTS

| | | | |
|---|---|---|---|
| 4,035,718 A | * | 7/1977 | Chandler ............. G01V 3/32 324/303 |
| 4,401,947 A | | 8/1983 | Cox |
| 5,432,446 A | | 7/1995 | MacInnis et al. |
| 5,451,873 A | | 9/1995 | Freedman et al. |

(Continued)

OTHER PUBLICATIONS

International Search Report and Written Opinion for International Application No. PCT/US2019/038373; Date of Completion: Oct. 8, 2019; dated Oct. 8, 2019; 8 pages total.

*Primary Examiner* — Rishi R Patel
(74) *Attorney, Agent, or Firm* — Cantor Colburn LLP

(57) ABSTRACT

An apparatus for performing a downhole nuclear magnetic resonance (NMR) experiment on a subsurface material in a volume of interest includes: a carrier configured to be conveyed through a borehole penetrating the subsurface material; an NMR sensor assembly disposed on the carrier and comprising a static magnetic field source configured to polarize nuclei of the subsurface material in the volume of interest and an antenna configured to receive NMR signals; and a receiver circuit disposed on the NMR sensor assembly and configured to process received NMR signals to perform the downhole NMR experiment; wherein (i) the receiver circuit is disposed in a pressure-excluding enclosure and (ii) the antenna, the static magnetic field source, and the pressure-excluding enclosure are disposed in a pressure-balancing fluid that is at least partially enclosed by an enclosure of non-metallic material.

19 Claims, 8 Drawing Sheets

(56) References Cited

U.S. PATENT DOCUMENTS

| | | | | |
|---|---|---|---|---|
| 5,491,415 | A | * | 2/1996 | Holmes ............ G01R 33/34007 |
| | | | | 324/318 |
| 5,831,433 | A | * | 11/1998 | Sezginer .................. G01V 3/32 |
| | | | | 324/303 |
| 6,268,726 | B1 | * | 7/2001 | Prammer ................. G01V 3/32 |
| | | | | 324/303 |
| 2008/0174397 | A1 | * | 7/2008 | de Rooij ............ G01R 33/3621 |
| | | | | 336/200 |
| 2012/0068700 | A1 | * | 3/2012 | Chen ........................ G01V 3/32 |
| | | | | 324/303 |
| 2013/0234706 | A1 | | 9/2013 | Mandal et al. |
| 2018/0149765 | A1 | * | 5/2018 | Hurlimann ......... G01R 33/3415 |
| 2019/0049617 | A1 | * | 2/2019 | Kadayam Viswanathan ............... |
| | | | | G01R 33/4641 |

\* cited by examiner

81 — Disposing an NMR tool in a borehole penetrating a subsurface material using a carrier, the NMR tool includes an NMR sensor assembly having a static magnetic field source for polarizing nuclei of the subsurface material in a volume of interest, an antenna for receiving an NMR signal, and receiver circuity disposed on the NMR sensor assembly and configured for processing the received NMR signals to perform an NMR experiment on the subsurface material in the volume of interest, wherein (i) the receiver circuitry is disposed in a pressure-excluding enclosure and (ii) the antenna, the static magnetic field source, and the pressure-excluding enclosure are disposed in a pressure-balancing fluid that is at least partially enclosed by an enclosure of non-metallic material 82 — Performing the downhole NMR experiment using the NMR tool

DOWNHOLE NMR TOOL WITH RECEIVER ON SENSOR

CROSS REFERENCE TO RELATED APPLICATIONS

This application claims priority to U.S. Application Ser. No. 62/688,704 filed Jun. 22, 2018, the disclosure of which is incorporated by reference herein in its entirety.

BACKGROUND

Geologic formations may be used for many applications such as hydrocarbon production, geothermal production, and carbon dioxide sequestration. Typically, boreholes are drilled into the formations to access them. Various downhole tools or instruments may be conveyed in the boreholes in order to characterize the formations. Characterization of the formations and the fluids within provides valuable information related to the intended use of the formations so drilling and production resources can be used more efficiently.

One type of downhole instrument is a nuclear magnetic resonance (NMR) tool that measures nuclear magnetic properties of formation materials such as fluids within a rock matrix. Multi-frequency NMR tools are beneficial because they offer the potential for depth profiling and are compatible with efficient logging acquisitions since multiple frequency and thus multiple depth NMR experiments can be interleaved in time. Multiple frequency experiments, however, require receiving NMR signals over a wide range of frequencies. Hence, innovations that increase the signal-to-noise ratio (SNR) and thus the sensitivity of NMR signal reception over that range of frequencies would be well received in the drilling and production industries.

SUMMARY

Disclosed is an apparatus for performing a downhole nuclear magnetic resonance (NMR) experiment on a subsurface material in a volume of interest. The apparatus includes: a carrier configured to be conveyed through a borehole penetrating the subsurface material; an NMR sensor assembly disposed on the carrier and comprising a static magnetic field source configured to polarize nuclei of the subsurface material in the volume of interest and an antenna configured to receive NMR signals; and a receiver circuit disposed on the NMR sensor assembly and configured to process received NMR signals to perform the downhole NMR experiment; wherein (i) the receiver circuit is disposed in a pressure-excluding enclosure and (ii) the antenna, the static magnetic field source, and the pressure-excluding enclosure are disposed in a pressure-balancing fluid that is at least partially enclosed by an enclosure of non-metallic material.

Also disclosed is a method for performing a downhole nuclear magnetic resonance (NMR) experiment on a subsurface material in a volume of interest. The method includes: disposing an NMR tool in a borehole penetrating the subsurface material using a carrier, the NMR tool comprising an NMR sensor assembly having a static magnetic field source for polarizing nuclei of the subsurface material in the volume of interest, an antenna for receiving an NMR signal, and a receiver circuit disposed on the NMR sensor assembly and configured for processing the received NMR signal to perform the NMR experiment, wherein (i) the receiver circuit is disposed in a pressure-excluding enclosure and (ii) the antenna, the static magnetic field source, and the pressure-excluding enclosure are disposed in a pressure-balancing fluid that is at least partially enclosed by an enclosure of non-metallic material; and performing the downhole NMR experiment using the NMR tool.

BRIEF DESCRIPTION OF THE DRAWINGS

The following descriptions should not be considered limiting in any way. With reference to the accompanying drawings, like elements are numbered alike:

FIG. 8 is a flow chart for a method for performing a downhole NMR experiment.

DETAILED DESCRIPTION

A detailed description of one or more embodiments of the disclosed apparatus and method are presented herein by way of exemplification and not limitation with reference to the Figures.

Disclosed are apparatuses and methods for performing a nuclear magnetic resonance (NMR) experiment on an earth formation that provides for increased signal-to-noise ratio (SNR) and thus increased sensitivity of received NMR signals. The increased SNR and sensitivity is provided by disposing an NMR signal receiver circuit on an NMR signal sensor or antenna. Conventional NMR tools typically have their conventional receiver circuitry disposed about four or more feet away from the receiver antenna by using a cable to connect the conventional receiver circuitry to the antenna. This amount of cable can induce noise in very low level signals such as the NMR signals carried in the cable resulting in decreased sensitivity. This mode of noise induction is avoided by disposing the receiver circuit for processing raw NMR signals on the antenna. The receiver circuit provides a digital output signal that is not susceptible to further degradation and can be processed further to estimate one or more properties of the earth formation.

Figure 1:
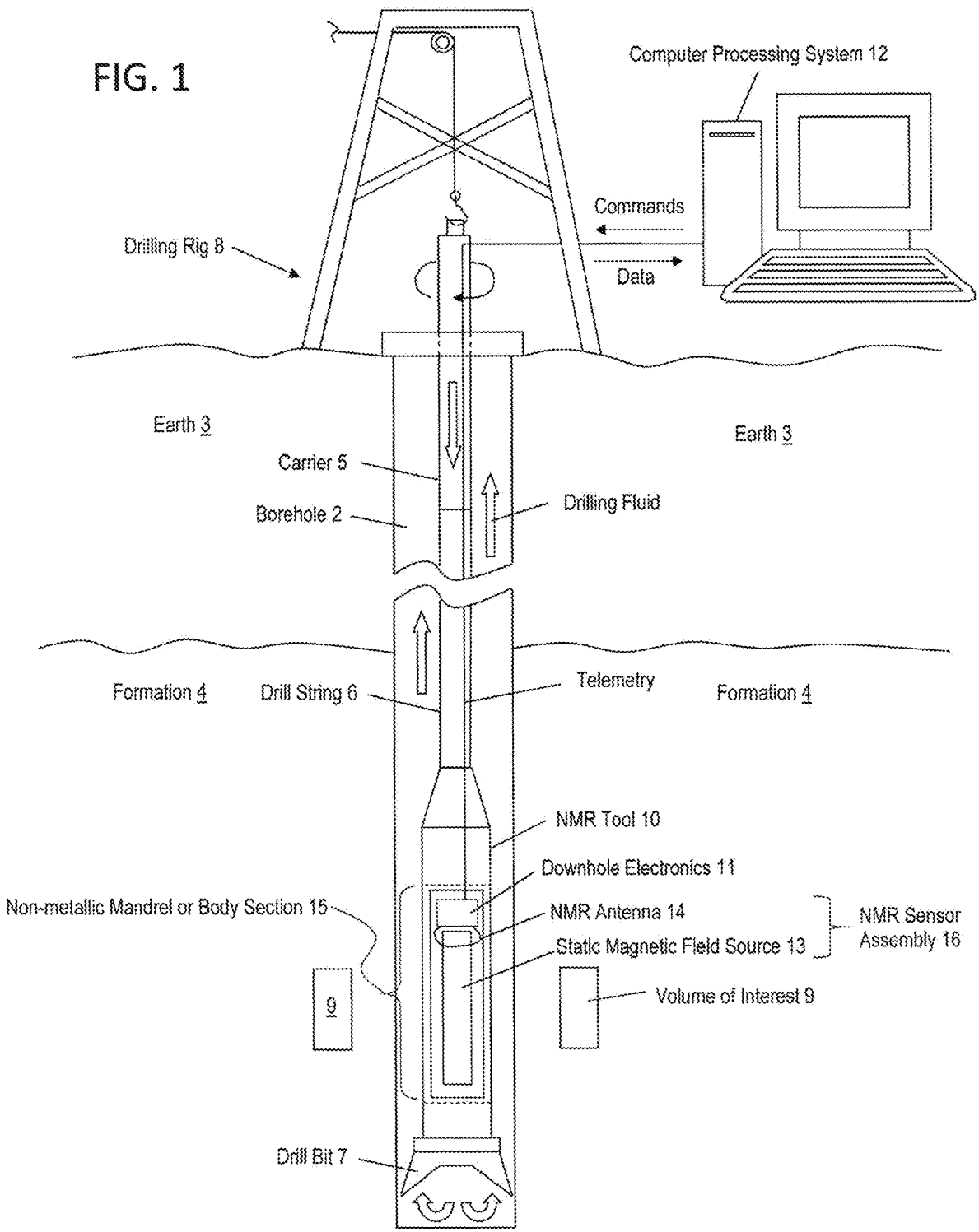
FIG. 1 illustrates a downhole NMR tool disposed in a borehole penetrating the earth.

FIG. 1 illustrates a cross-sectional view of an embodiment of an NMR tool 10 disposed in a borehole 2 penetrating the earth 3, which includes an earth formation 4. The NMR tool 10 is conveyed through the borehole 2 by a carrier 5, which can be a drill tubular such as a drill string 6. A drill bit 7 is disposed at the distal end of the drill string 6. A drill rig 8 is configured to conduct drilling operations such as rotating the drill string 6 and thus the drill bit 7 in order to drill the borehole 2. In addition, the drill rig 8 is configured to pump drilling mud (i.e., drill fluid) through the drill string 6 in order to lubricate the drill bit 7 and flush cuttings from the borehole 2. Downhole electronics 11 are configured to operate the NMR tool 10, process digital measurement data obtained downhole, and/or act as an interface with telemetry to communicate data or commands between downhole components and a computer processing system 12 disposed at the surface of the earth 3. Non-limiting embodiments of the telemetry include pulsed-mud and wired drill pipe for real time communications. System operation and data processing operations may be performed by the downhole electronics 11, the computer processing system 12, or a combination thereof. In an alternative embodiment, the carrier 5 may be an armored wireline, which can support and convey the NMR tool 10 and also provide a conductor for communications with the surface processing system 12.

The NMR tool 10 is configured to perform single-frequency and/or multi-frequency NMR measurements on the formation 4. NMR measurements are performed in one or more volumes of interest 9. These volumes may be torus-shaped, surrounding the NMR tool 10, or, when using a side-looking NMR tool, may be directed to one side only. The NMR experiments may measure signals that are a result of the summation of individual spins at various spatial locations within the formation. The measured signals are influenced by a number of factors such as the local field homogeneity, the strength of the static and radiofrequency (RF) magnetic fields, the longitudinal relaxation time constants $T_1$ and/or a transverse relaxation time constants $T_2$ (or distributions thereof, see below), etc. $T_1$ is the time constant describing magnetic polarization of the hydrogen atoms in the volume of interest. $T_2$ represents the exponential decay time constant of spins, which is both a function of the formation fluids and the interaction of fluids with the rock pore surface. Transverse relaxation is rapid in high-gradient, multi-frequency NMR requiring data acquisition employing a refocusing scheme (i.e. using a sequence such as CPMG) to account for the strong spin phase incoherence of the hydrogen nuclei (protons) or nuclei of interest within the formation 4 material.

In general, there is not one single value of $T_2$ for fluids contained within formation rock, but a wide distribution of values lying anywhere between fractions of a millisecond (ms) and several seconds for example. The distributions of $T_1$ and $T_2$ values may serve as primary inputs used for fluid typing, allowing the calculation of formation properties, such as porosity, permeability, or fluid properties, such as viscosity and fluid state. These formation properties may be derived as a function of depth into the formation, and together may be referred to as an NMR log.

Components in the NMR tool 10 include a static magnetic field source 13 that magnetizes formation fluids and an NMR antenna 14. The static magnetic field source 13 and the NMR antenna 14 together may be referred to as an NMR sensor assembly 16. In one or more embodiments, the static magnetic field source 13 is one or more permanent magnets such as rare earth magnets. The NMR antenna 14 can be (1) one or more antennas configured for both transmitting and receiving NMR signals or (2) one or more antennas for receiving NMR signals and one or more antennas for transmitting NMR signals. An NMR transmitter antenna transmits precisely timed bursts of radio-frequency energy to excite the spins. In a time period between these pulses, the NMR receiver antenna receives an echo signal from those protons (or nuclei of interest) that are on-resonance with the static magnetic field produced by the magnetic field source. Because a linear relationship exists between the resonance frequency and the strength of the static magnetic field, the frequency of transmitted radio-frequency energy can be tuned to investigate volumes of interest having different diameters or depths around the NMR tool 10. The antenna 14, the static magnetic field source 13, and at least some of the downhole electronics 11 are at least partially enclosed by a section 15 of a non-metallic mandrel or body. Parts of the mandrel or body external to the section 15 may be metallic.

It can be appreciated that the NMR tool 10 may be calibrated to a known porosity and/or other known properties of a subsurface material by analysis or by testing in field or laboratory conditions using subsurface materials having a known porosity and/or other known properties.

Figure 2:
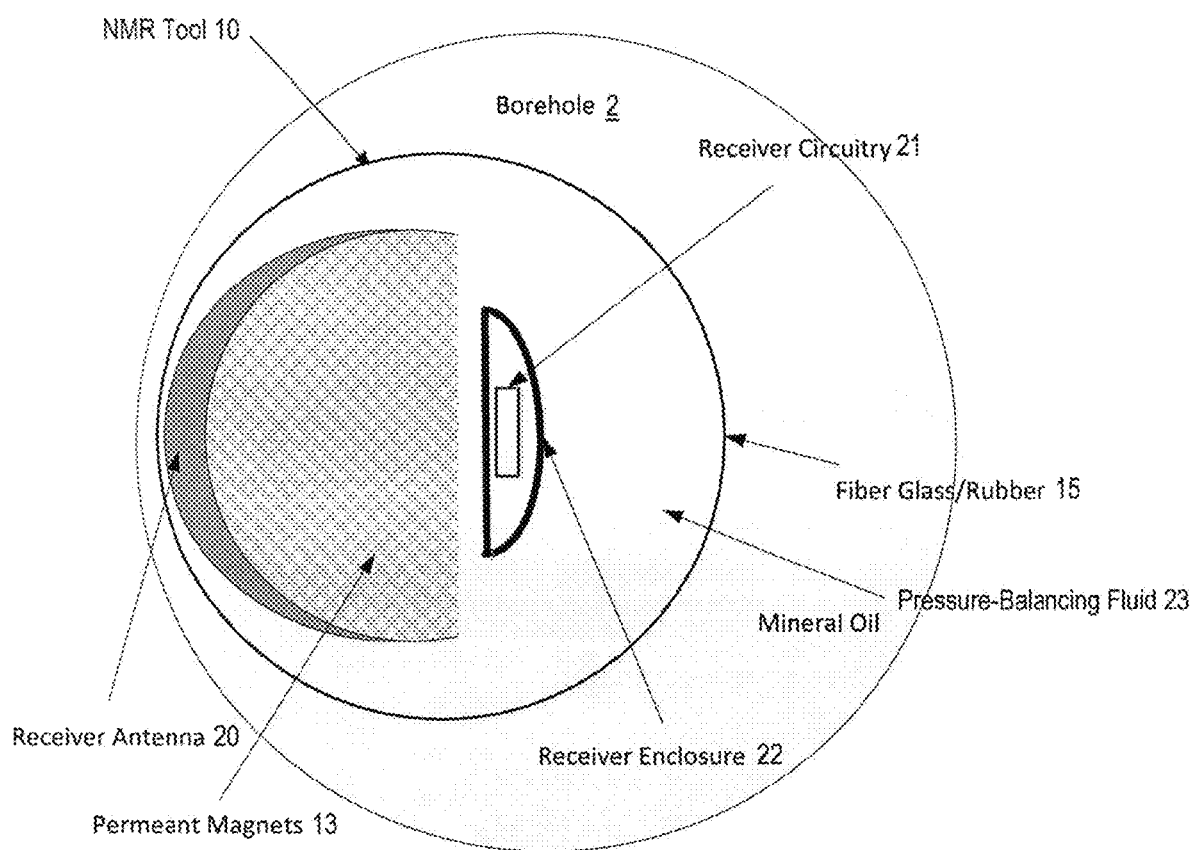
FIG. 2 depicts aspects of a receiver circuit disposed on an NMR sensor of the downhole NMR tool.

FIG. 2 depicts aspects of a receiver circuit 21 that may be implemented by the downhole electronics 11. The receiver circuit 21 is disposed on the NMR sensor assembly 16 that includes a receiver antenna 20 (represented as the NMR antenna 14 in FIG. 1) and the static magnetic field source 13 of the downhole NMR tool 10. Here, "disposed on" relates to the receiver circuitry 21 being disposed on and/or mechanically connected to the NMR sensor assembly 16 thus avoiding using a connector cable, which can be several feet long, to connect the receiver antenna 20 to the receiver circuit 21. The receiver antenna 20, the static magnetic field source 13, and a pressure-excluding enclosure 22 are disposed in a pressure balancing fluid 23. In one or more embodiments, the pressure balancing fluid 23 is mineral oil. The pressure-excluding enclosure 22 is configured to contain the receiver circuit 21 at atmospheric pressure. Non-limiting embodiments of material for the pressure-excluding enclosure 22 include a non-magnetic material such as titanium, aluminum, and a non-magnetic stainless steel. A transmitter circuit 23 for transmitting NMR signals may also be disposed in the pressure-excluding enclosure 22. The section 15 of a mandrel or body of the NMR tool 10 containing the static magnetic field source 13 and the antenna 14, 20 is made of a non-conductive and non-magnetic material such as a non-metallic material, fiber-glass, rubber, and/or an elastomer as non-limiting examples. The pressure balancing fluid 23 prevents the section 15 from collapsing under borehole pressure and may also provide a heat sink for removing heat from the electrical components.

Figure 3:
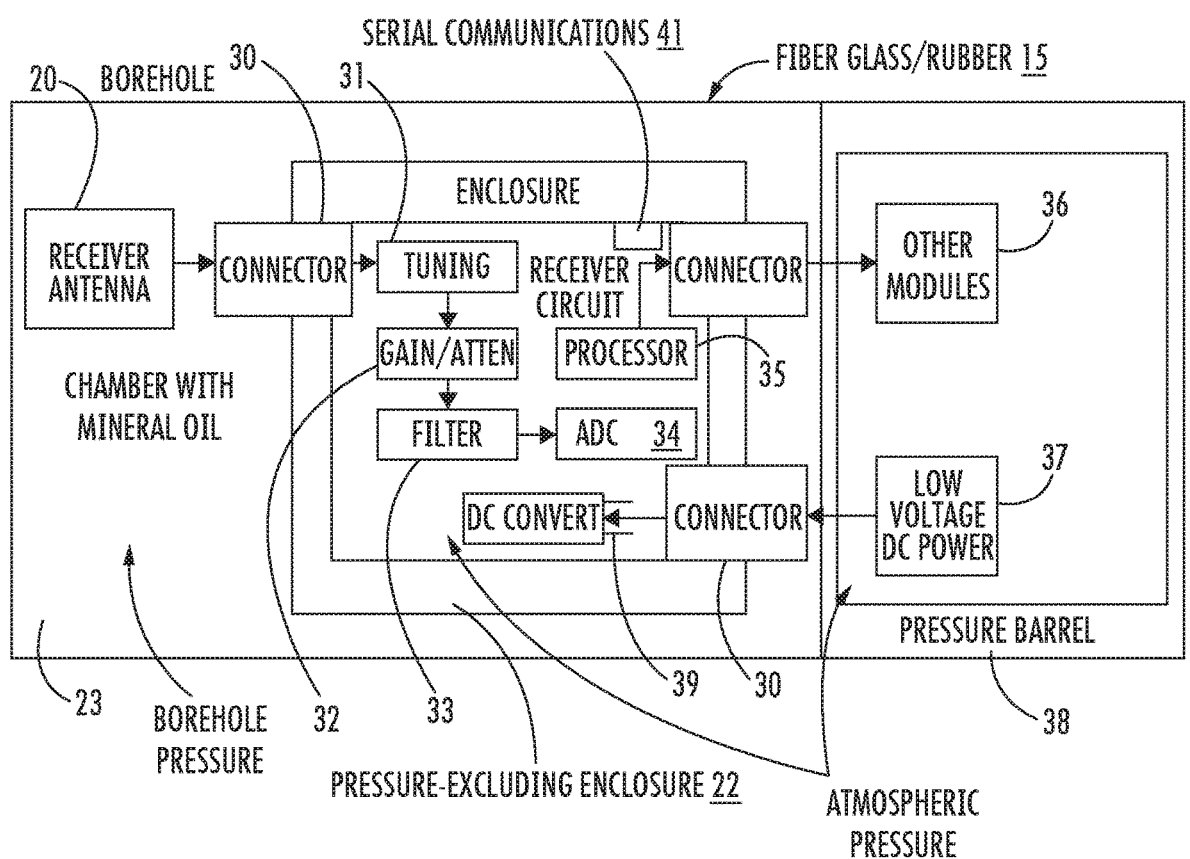
FIG. 3 depicts aspects of the receiver circuit and other circuitry in the downhole NMR tool.

FIG. 3 depicts aspects of the receiver circuit 21 and other circuitry or modules in the downhole NMR tool 10. The receiver antenna 20 is electrically connected to the receiver circuit through a pressure-penetration or connector referred to herein as a pressure-excluding connector 30 that is configured to prevent pressurized fluid from entering the pressure-excluding enclosure 22. The receiver circuit 21 includes a tuning module 31, a gain/attenuation module 32, a filter module 33, an analog-to-digital converter (ADC) module 34, and a digital processor module 35. While being illustrated as separate modules or circuits, some or all of these circuits may be combined. The tuning module 31 is configured to measure the resonant frequency of the antenna and tune the impedance of the antenna to coordinate with the frequency of the NMR signal being transmitted. The gain/attenuation module 32 is configured to add gain to low level NMR signals to provide increased dynamic range or to attenuate high level NMR signals to prevent saturating the receiver circuit 21. The filter module 33 is configured as a bandpass filter to filter out unwanted noise that is outside the bandwidth of the passed frequencies. The ADC module 34 is configured to convert filtered analog signals to digital signals. The digital processor module 35 is configured to process the digital signals such as putting them into a format that can be further processed by other modules 36. One or more or the other modules 36 may be configured to process the digital NMR signals into NMR logging data for example. A low voltage direct current (DC) power supply 37 is configured to supply power to the receiver circuit 21. The other modules 36 and the DC power supply 37 may be disposed outside of the section 15 of the mandrel or body of the NMR tool 10 such as within a metallic pressure-excluding enclosure 38.

Figure 4:
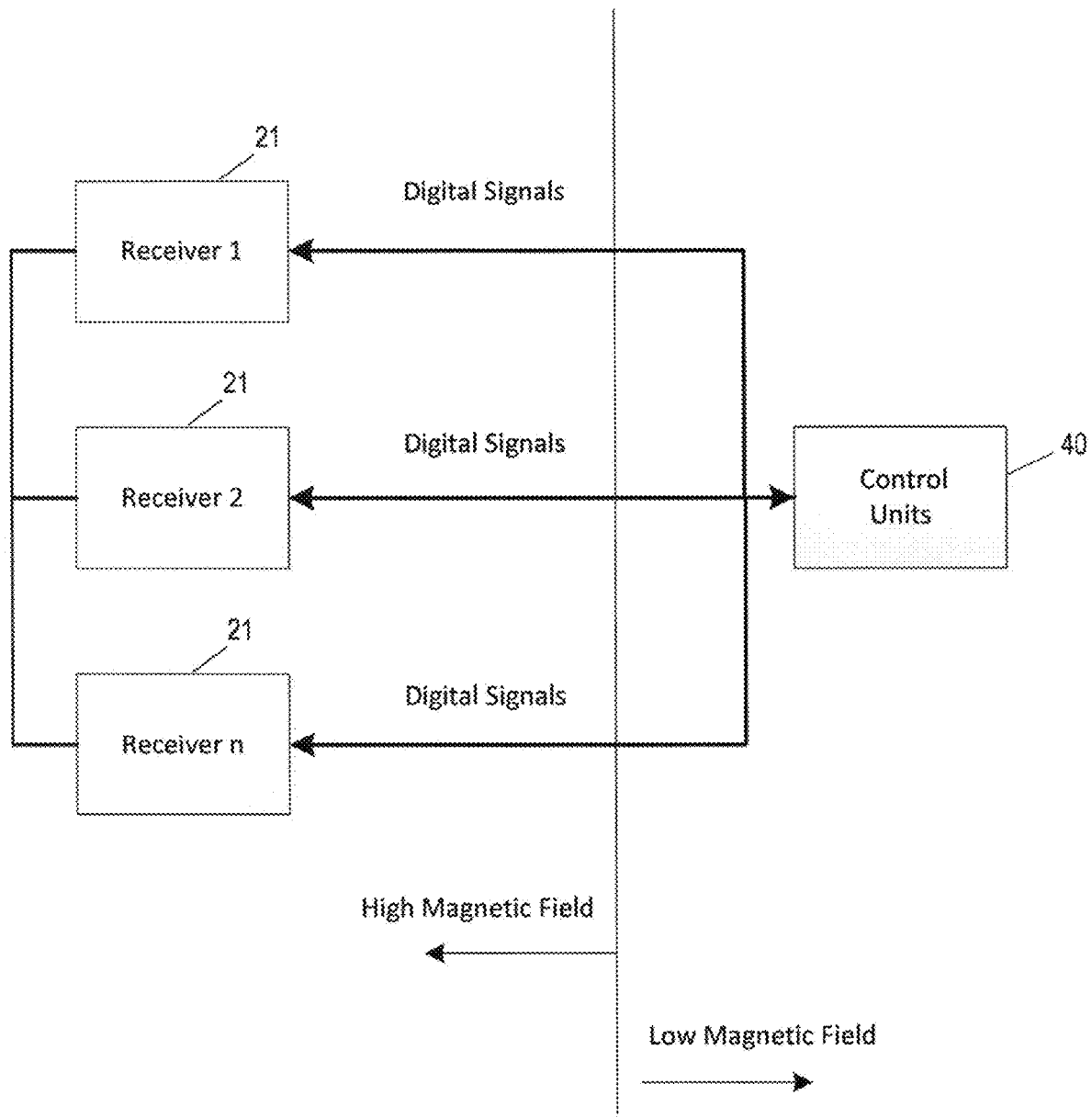
FIG. 4 depicts aspects of synchronizing multiple receiver modules by avoidance of analog signals to and from high magnetic field environments.

FIG. 4 depicts aspects of synchronizing multiple receiver modules 21 by avoidance of analog signals to and from high magnetic field environments. In the embodiment of FIG. 4, a control unit 40 for synchronizing operation of the receiver modules 21 is disposed in a low magnetic field environment such as outside the section 15 of the mandrel or body. The control unit 40 is configured to transmit and receive digital signals to perform the synchronizing recognizing that digital signals are less prone to distortion the high magnetic field environments than analog signals. Because each receiver module 21 is associated with a separate NMR antenna 14, the synchronizing enables operation of one NMR antenna 14 and one receiver module 21 combination without interference from other antenna/receiver combinations.

Figure 5:
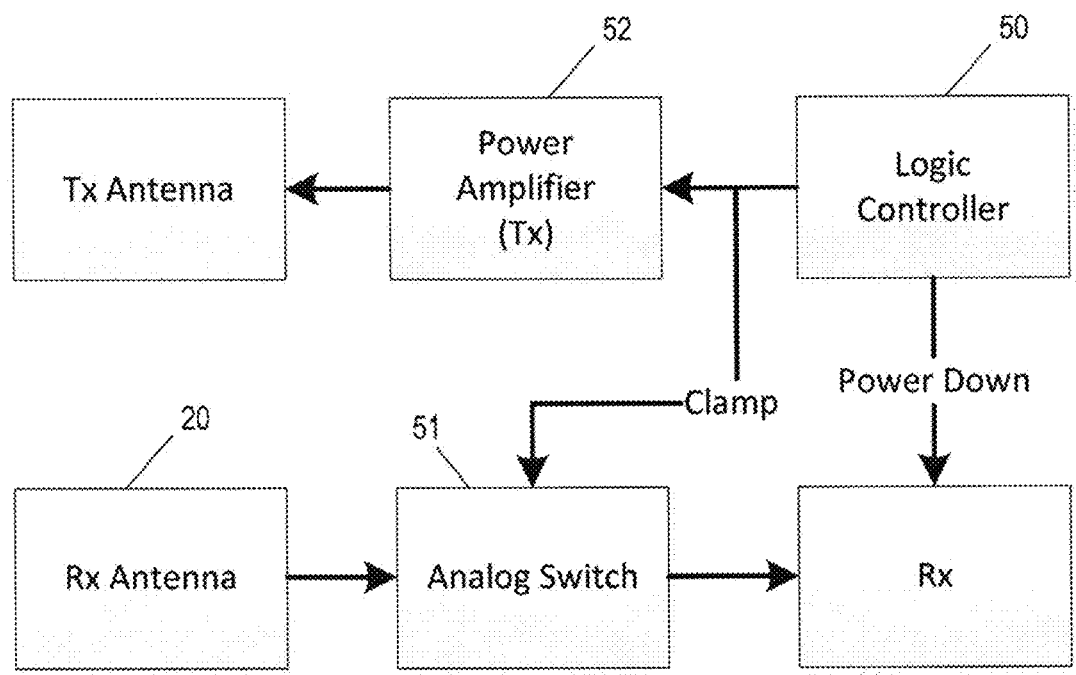
FIG. 5 depicts aspects of down-powering and clamping to prevent saturation of a receiver module.

FIG. 5 depicts aspects of down-powering and clamping to prevent saturation of the receiver circuit 21. In the embodiment of FIG. 5, a logic controller 50 is configured to operate an analog switch 51 to short or clamp down the input to the receiver circuit 21 and to power-down the receiver circuit 21 to prevent receiver circuit saturation when the logic controller 50 calls on a power amplifier 52 to transmit an NMR signal. When the power amplifier 52 is finished transmitting the NMR signal, the logic controller 50 removes the clamp and the power-down features to allow the receiver circuit 21 to receive the return NMR signal.

Figure 6A:
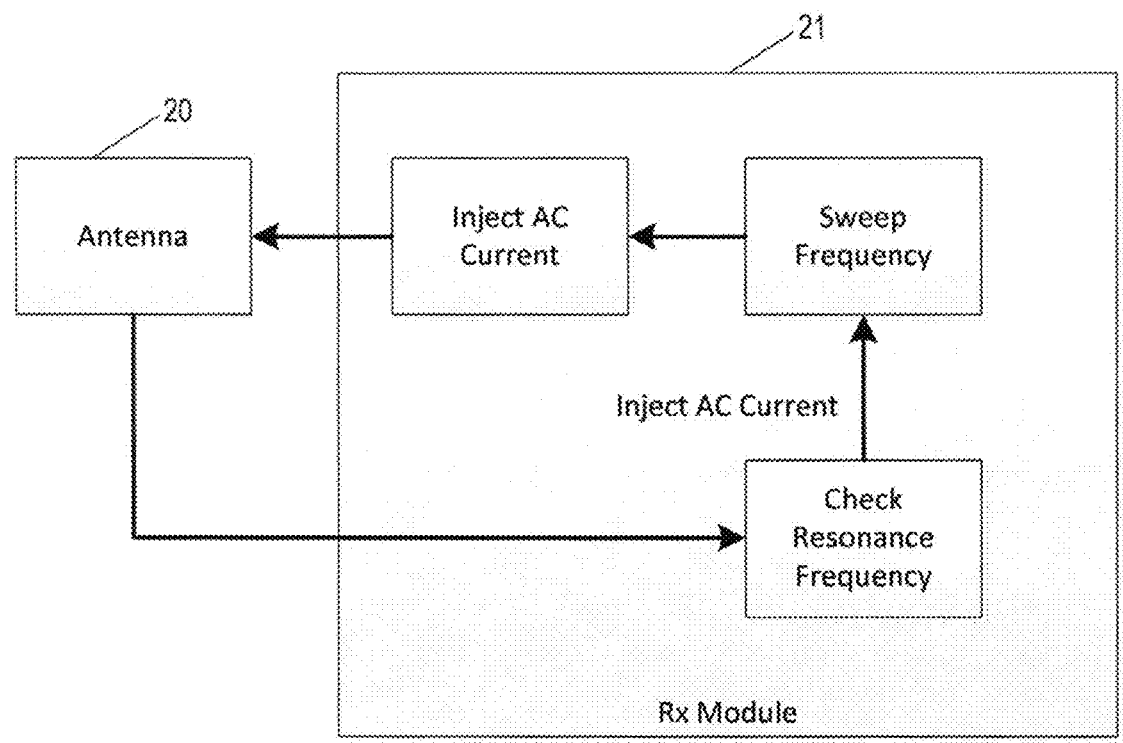
FIGS. 6A and 6B, collectively referred to as FIG. 6, depict aspects of tuning an NMR antenna for receiving an NMR signal.
Figure 6B:
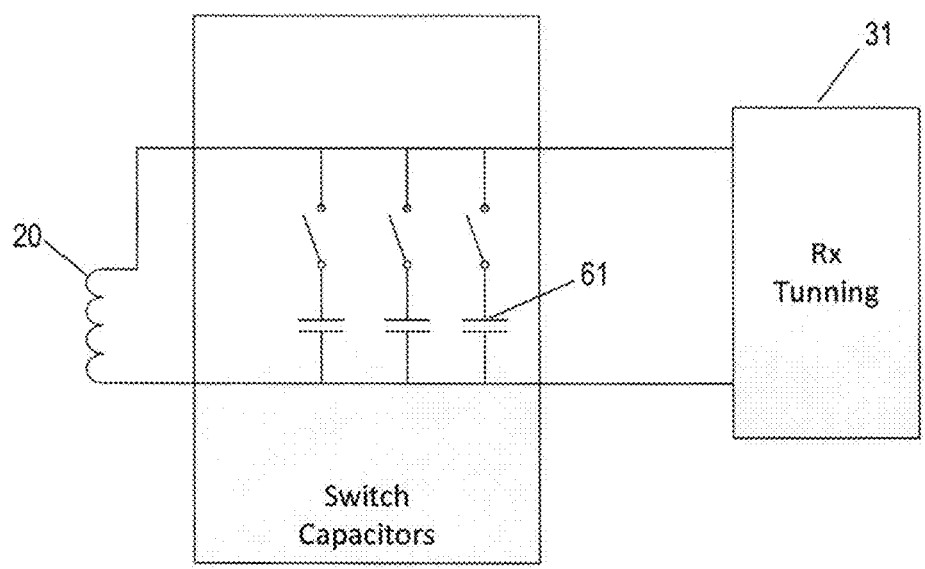

FIG. 6 depicts aspects of tuning an NMR antenna for receiving an NMR signal. In the embodiment of FIG. 6A, the receiver circuit 21, which may be a module, includes components for sweeping a frequency of electrical current injected into an NMR transmitter antenna. Based on an amount of injected current as a function of frequency, a resonant frequency of the NMR antenna can be determined. In the embodiment of FIG. 6B, the receiver tuning circuit 31 is configured to switch capacitors 61 in or out of an antenna circuit having the NMR receiver antenna 20 in order to adjust the resonant frequency of the antenna circuit to coordinate with or match the frequency of the NMR signal being transmitted.

Figure 7:
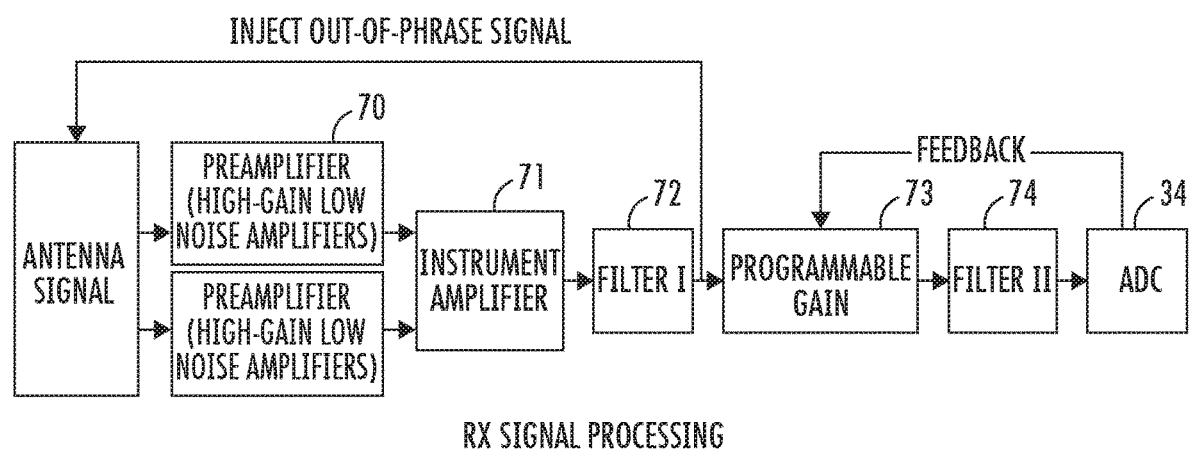
FIG. 7 depicts aspects of processing a received NMR signal.

FIG. 7 depicts aspects of processing a received NMR signal using the receiver circuit 21. In the embodiment of FIG. 7, two preamplifier paths 70, which are high-gain low noise amplifiers, are disposed to amplify the NMR signal received by the positive and negative terminals of the NMR antenna 20. The output of the two preamplifiers 70 is fed to an instrument amplifier 71, which has a differential input. A first filter 72 filters the output of the instrumentation amplifier 71. It can be appreciated that the gain and filtering operations can be conducted multiple times to improve the SNR and maintain an appropriate range for digitalization. The output of the first filter 72 is injected back to the received NMR signal as an out-of-phase signal to spoil the Q-factor of the antenna circuit by flattening and broadening the frequency response of the NMR antenna 20. Multiple Q-factors enable the receiver circuit 21 to detect radio-frequency (RF) signals at a broad range of frequencies. The output of the first filter 72 is also fed to a programmable gain module 73 that is configured to vary the gain in response to a feedback signal from the ADC module 34 in order to increase the dynamic range while avoiding saturation. A second filter 74 filters the output of the programmable gain module to further eliminate noise. Output of the second filter 74 is then fed to the ADC module 34.

Electronic circuits and components within the high magnetic field region (i.e., within the mandrel or body section 15 having the static magnetic field source 13) are free of inductors and transformers having magnetic cores because these types of components can be affected by the static and RF magnetic fields. Consequently, linear regulators may be used as power supplies. In one or more embodiments, powdered iron and ferrite cores are replaced by air-wound components 24 (see FIG. 3) where needed in any of the circuits and components in the receiver circuit 21. Also electronic components or parts in the high magnetic field region are selected to avoid using nickel or tin. In their place, component parts such as pins 39 illustrated in FIG. 3 may be selected to have non-magnetic materials such as copper, gold or silver.

The receiver circuit 21 may be built using a rigid printed circuit board assembly (PCBA), a flexible PCBA, a multi-chip module (MCM), or an application-specific integrated circuit (ASIC). In addition, part of the circuit may be immersed in the pressure-balancing fluid to reduce dimensions of the pressure enclosure 22.

The pressure-penetrations or connectors 30 are configured to endure borehole pressure, which in one or more embodiments can be 20,000 to 25,000 psi. In order to withstand such pressures, pins in the connectors 30 may be larger than in lower pressure applications. Due to their larger size, a fewer number of pins may be available thus requiring use of serial communications 41 as illustrated in FIG. 3.

FIG. 8 is a flow chart for a method 80 for performing a downhole nuclear magnetic resonance (NMR) experiment on a subsurface material in a volume of interest. Block 81 calls for disposing an NMR tool in a borehole penetrating the subsurface material using a carrier, the NMR tool includes an NMR sensor assembly having a static magnetic field source for polarizing nuclei of the subsurface material in the volume of interest, an antenna for receiving an NMR signal, and a receiver circuit disposed on the NMR sensor assembly and configured to process the received NMR signal to perform the NMR experiment, wherein (i) the receiver circuit is disposed in a pressure-excluding enclosure and (ii) the antenna, the static magnetic field source, and the pressure-excluding enclosure are disposed in a pressure-balancing fluid that is at least partially enclosed by an enclosure of non-metallic material. Because the receiver circuit is disposed on the NMR sensor assembly, long cables (e.g., length greater than or equal to one foot) used to connect the antenna to the receiver circuit are not required. Rather in one or more embodiments, the antenna may be connected directly to a structural element of the antenna. In one or more embodiments, the pressure-balancing fluid is a mineral oil. In one or more embodiments, the pressure-excluding enclosure comprises titanium. Non-limiting embodiments of the non-metallic material include fiberglass, rubber, an elastomer, and/or any composite material that allows a radio-frequency signal to pass through.

Block 82 calls for performing the downhole NMR experiment using the NMR tool. The NMR experiment can include determining NMR signal characteristics such as $T_1$ and/or $T_2$ and deriving formation properties, such as porosity, permeability, or fluid properties, such as viscosity and fluid state from the NMR signal characteristics. The NMR experiment includes receiving an NMR signal with an antenna assembly disposed on the carrier. In general, received NMR signals are "echoes" due to nuclei precessing in a magnetic field as a result of transmitted radio-frequency electromagnetic energy stimulating those nuclei.

The method 80 may also include transmitting the received NMR signal from the antenna through a pressure-excluding connector to the receiver circuit. In one or more embodiments, the pressure-excluding connector is directly connected to the antenna such that a cable or bus is not used to connect the antenna to the receiver circuit.

The method 80 may also include conveying a carrier through the borehole where the NMR sensor assembly is disposed on the carrier.

The method 80 may also include providing power to the receiver circuit through the pressure-excluding connector from a power supply that is disposed external to the enclosure of non-magnetic material. In one or more embodiments, the power supply is disposed in a second pressure-excluding enclosure.

The method 80 may also include performing one or more physical actions on the formation based upon one or more formation properties derived from the NMR experiment. Non-limiting embodiments of the physical actions include drilling a borehole at a selected location and/or with a selected trajectory to efficiently (i.e., provide cost savings) access hydrocarbons, hydraulically fracture the formation at a selected depth interval to increase permeability at that depth interval, and performing completion operations such as perforating a casing lining a borehole at a selected depth interval to access hydrocarbons at that depth interval. Hydraulic fracturing may be performed by injecting fracturing fluid into the borehole 2 using hydraulic fracturing apparatus. Perforations may be performed using a downhole perforation tool and conveyed through the borehole 2 by the carrier 5.

In support of the teachings herein, various analysis components may be used, including a digital and/or an analog system. For example, the downhole electronics 11 and/or the surface computer processing system 12 may include digital and/or analog systems. The system may have components such as a processor, storage media, memory, input, output, communications link (wired, wireless, optical or other), user interfaces (e.g., a display or printer), software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a non-transitory computer readable medium, including memory (ROMs, RAMs), optical (CD-ROMs), or magnetic (disks, hard drives), or any other type that when executed causes a computer to implement the method of the present invention. These instructions may provide for equipment operation control, data collection and analysis and other functions deemed relevant by a system designer, owner, user or other such personnel, in addition to the functions described in this disclosure.

Further, various other components may be included and called upon for providing for aspects of the teachings herein. For example, a power supply (e.g., at least one of a generator, a remote supply and a battery), magnet, electromagnet, sensor, electrode, transmitter, receiver, transceiver, antenna, controller, optical unit, electrical unit or electromechanical unit may be included in support of the various aspects discussed herein or in support of other functions beyond this disclosure.

The term "carrier" as used herein means any device, device component, combination of devices, media and/or member that may be used to convey, house, support or otherwise facilitate the use of another device, device component, combination of devices, media and/or member. Other exemplary non-limiting carriers include drill strings of the coiled tube type, of the jointed pipe type and any combination or portion thereof. Other carrier examples include casing pipes, wirelines, wireline sondes, slickline sondes, drop shots, bottom-hole-assemblies, drill string inserts, modules, internal housings and substrate portions thereof.

Set forth below are some embodiments of the foregoing disclosure:

Embodiment 1

An apparatus for performing a downhole nuclear magnetic resonance (NMR) experiment on a subsurface material in a volume of interest, the apparatus comprising: a carrier configured to be conveyed through a borehole penetrating the subsurface material; an NMR sensor assembly disposed on the carrier and comprising a static magnetic field source configured to polarize nuclei of the subsurface material in the volume of interest and an antenna configured to receive NMR signals; and a receiver circuit disposed on the NMR sensor assembly and configured to process received NMR signals to perform the downhole NMR experiment; wherein (i) the receiver circuit is disposed in a pressure-excluding enclosure and (ii) the antenna, the static magnetic field source, and the pressure-excluding enclosure are disposed in a pressure-balancing fluid that is at least partially enclosed by an enclosure of non-metallic material.

Embodiment 2

The apparatus according to any previous embodiment, wherein the static magnetic field source comprises one or more permanent magnets.

Embodiment 3

The apparatus according to any previous embodiment, wherein the receiver circuit does not include any metallic wound components.

Embodiment 4

The apparatus according to any previous embodiment, wherein the receiver circuit includes an air-wound component.

Embodiment 5

The apparatus according to any previous embodiment, wherein the receiver circuit comprises non-magnetic pins.

Embodiment 6

The apparatus according to any previous embodiment, wherein the non-magnetic pins comprises at least one of copper, gold, and silver.

Embodiment 7

The apparatus according to any previous embodiment, wherein the receiver circuit comprises serial communications.

Embodiment 8

The apparatus according to any previous embodiment, wherein the receiver circuit comprises an analog-to-digital converter.

Embodiment 9

The apparatus according to any previous embodiment, wherein the pressure-excluding enclosure comprises at least one of titanium and aluminum.

Embodiment 10

The apparatus according to any previous embodiment, wherein the pressure-balancing fluid comprises mineral oil.

Embodiment 11

The apparatus according to any previous embodiment, wherein the enclosure of non-metallic material comprises at least one of fiberglass, rubber, or an elastomer.

Embodiment 12

The apparatus according to any previous embodiment, further comprising an electrical power supply disposed external to the enclosure of non-metallic material.

Embodiment 13

The apparatus according to any previous embodiment, wherein the pressure-excluding enclosure comprises a pressure-excluding connector for conducting signals and/or power through the pressure-excluding enclosure.

Embodiment 14

The apparatus according to any previous embodiment, further comprising a controller configured to clamp down input to the receiver circuit and powering down the receiver circuit when an NMR signal is not required to be received.

Embodiment 15

The apparatus according to any previous embodiment, wherein the carrier comprises a drill string, a wireline, or a slickline.

Embodiment 16

A method for performing a downhole nuclear magnetic resonance (NMR) experiment on a subsurface material in a volume of interest, the method comprising: disposing an NMR tool in a borehole penetrating the subsurface material using a carrier, the NMR tool comprising an NMR sensor assembly having a static magnetic field source for polarizing nuclei of the subsurface material in the volume of interest, an antenna for receiving an NMR signal, and a receiver circuit disposed on the NMR sensor assembly and configured for processing the received NMR signal to perform the NMR experiment, wherein (i) the receiver circuit is disposed in a pressure-excluding enclosure and (ii) the antenna, the static magnetic field source, and the pressure-excluding enclosure are disposed in a pressure-balancing fluid that is at least partially enclosed by an enclosure of non-metallic material; and performing the downhole NMR experiment using the NMR tool.

Embodiment 17

The method according to any previous embodiment, further comprising tuning the antenna using a tuning module in the receiver circuit.

Elements of the embodiments have been introduced with either the articles "a" or "an." The articles are intended to mean that there are one or more of the elements. The terms "including" and "having" and the like are intended to be inclusive such that there may be additional elements other than the elements listed. The conjunction "or" when used with a list of at least two terms is intended to mean any term or combination of terms. The term "configured" relates one or more structural limitations of a device that are required for the device to perform the function or operation for which the device is configured.

The flow diagram depicted herein is just an example. There may be many variations to this diagram or the steps (or operations) described therein without departing from the scope of the invention. For instance, the steps may be performed in a differing order, or steps may be added, deleted or modified. All of these variations are considered a part of the claimed invention.

The disclosure illustratively disclosed herein may be practiced in the absence of any element which is not specifically disclosed herein.

While one or more embodiments have been shown and described, modifications and substitutions may be made thereto without departing from the scope of the invention. Accordingly, it is to be understood that the present invention has been described by way of illustrations and not limitation.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims.

What is claimed is:

1. An apparatus for performing a downhole nuclear magnetic resonance (NMR) experiment on a subsurface material in a volume of interest, the apparatus comprising:
   a carrier configured to be conveyed through a borehole penetrating the subsurface material;
   an NMR sensor assembly disposed on the carrier and comprising a static magnetic field source configured to polarize nuclei of the subsurface material in the volume of interest and an antenna configured to receive NMR signals; and
   a receiver circuit disposed on the NMR sensor assembly and configured to process received NMR signals to perform the downhole NMR experiment, the receiver circuit not being connected to the antenna with a cable;

wherein (i) the receiver circuit is disposed in a pressure-excluding enclosure and (ii) the antenna, the static magnetic field source, and the pressure-excluding enclosure are disposed in a pressure-balancing fluid that is at least partially enclosed by an enclosure of non-metallic material.

2. The apparatus according to claim 1, wherein the static magnetic field source comprises one or more permanent magnets.

3. The apparatus according to claim 1, wherein the receiver circuit does not include any metallic wound components.

4. The apparatus according to claim 1, wherein the receiver circuit includes an air-wound component.

5. The apparatus according to claim 1, wherein the receiver circuit comprises non-magnetic pins.

6. The apparatus according to claim 5, wherein the non-magnetic pins comprise at least one of copper, gold, and silver.

7. The apparatus according to claim 1, wherein the receiver circuit comprises serial communications.

8. The apparatus according to claim 7, wherein the receiver circuit comprises an analog-to-digital converter.

9. The apparatus according to claim 1, wherein the pressure-excluding enclosure comprises at least one of titanium and aluminum.

10. The apparatus according to claim 1, wherein the pressure-balancing fluid comprises mineral oil.

11. The apparatus according to claim 1, wherein the enclosure of non-metallic material comprises at least one of fiberglass, rubber, or an elastomer.

12. The apparatus according to claim 1, further comprising an electrical power supply disposed external to the enclosure of non-metallic material.

13. The apparatus according to claim 1, wherein the pressure-excluding enclosure comprises a pressure-excluding connector for conducting signals and/or power through the pressure-excluding enclosure.

14. The apparatus according to claim 1, further comprising a controller configured to clamp down input to the receiver circuit and powering down the receiver circuit when an NMR signal is not required to be received.

15. The apparatus according to claim 1, wherein the carrier comprises a drill string, a wireline, or a slickline.

16. A method for performing a downhole nuclear magnetic resonance (NMR) experiment on a subsurface material in a volume of interest, the method comprising:

disposing an NMR tool in a borehole penetrating the subsurface material using a carrier, the NMR tool comprising an NMR sensor assembly having a static magnetic field source for polarizing nuclei of the subsurface material in the volume of interest, an antenna for receiving an NMR signal, and a receiver circuit disposed on the NMR sensor assembly and configured for processing the received NMR signal to perform the NMR experiment, the receiver circuit not being connected to the antenna with a cable, wherein (i) the receiver circuit is disposed in a pressure-excluding enclosure and (ii) the antenna, the static magnetic field source, and the pressure-excluding enclosure are disposed in a pressure-balancing fluid that is at least partially enclosed by an enclosure of non-metallic material; and performing the downhole NMR experiment using the NMR tool.

17. The method according to claim 16, further comprising tuning the antenna using a tuning module in the receiver circuit.

18. The apparatus according to claim 1, wherein the antenna and the receiver circuit comprise an antenna and receiver circuit combination and the apparatus comprises a plurality of antenna and receiver circuit combinations and the apparatus further comprises a controller disposed external to the enclosure of non-metallic material and in digital communication with each antenna and receiver circuit combination to synchronize the plurality of antenna and receiver circuit combinations such that each antenna and receiver circuit combination operates without interference from other antenna and receiver circuit combinations.

19. An apparatus for performing a downhole nuclear magnetic resonance (NMR) experiment on a subsurface material in a volume of interest, the apparatus comprising:

a carrier configured to be conveyed through a borehole penetrating the subsurface material;

an NMR sensor assembly disposed on the carrier and comprising a static magnetic field source configured to polarize nuclei of the subsurface material in the volume of interest and an antenna configured to receive NMR signals; and a receiver circuit disposed on the NMR sensor assembly and configured to process received NMR signals to perform the downhole NMR experiment, wherein the receiver circuit comprises a programmable gain module that receives a signal from the antenna and provides an input signal to a filter that provides a filtered signal to an analog-to-digital converter, the receiver circuit further comprising a feedback loop from the analog-to-digital converter to the programmable gain module to increase dynamic range while avoiding saturation;

wherein (i) the receiver circuit is disposed in a pressure-excluding enclosure and (ii) the antenna, the static magnetic field source, and the pressure-excluding enclosure are disposed in a pressure-balancing fluid that is at least partially enclosed by an enclosure of non-metallic material.

* * * * *